(12) United States Patent
Tiller

(10) Patent No.: US 6,864,754 B2
(45) Date of Patent: Mar. 8, 2005

(54) INTEGRAL MIXER AND OSCILLATOR DEVICE

(75) Inventor: Samuel A. Tiller, Ottawa (CA)

(73) Assignee: Research In Motion Limited, Waterloo (CA)

( * ) Notice: Subject to any disclaimer, the term of this patent is extended or adjusted under 35 U.S.C. 154(b) by 375 days.

(21) Appl. No.: 10/254,332

(22) Filed: Sep. 25, 2002

(65) Prior Publication Data

US 2003/0071693 A1 Apr. 17, 2003

Related U.S. Application Data

(60) Provisional application No. 60/328,411, filed on Oct. 12, 2001.

(51) Int. Cl.[7] .................................................. H03B 1/00
(52) U.S. Cl. ......................................... 331/74; 332/178
(58) Field of Search ........................... 331/74, 8, 108 R, 331/115, 132; 332/170, 178, 168, 135, 146; 445/333; 327/356, 358, 359

(56) References Cited

U.S. PATENT DOCUMENTS

| 4,052,682 A | * | 10/1977 | Wilcox | 332/152 |
|---|---|---|---|---|
| 4,308,471 A | * | 12/1981 | Misawa | 327/356 |
| 4,614,911 A | * | 9/1986 | Kawano | 329/362 |
| 4,635,003 A | * | 1/1987 | Fenk | 332/152 |
| 4,636,663 A | * | 1/1987 | Jongepier et al. | 327/113 |
| 4,833,340 A | * | 5/1989 | Deguchi | 327/246 |
| 4,931,746 A | * | 6/1990 | Trankle et al. | 330/254 |
| 5,329,189 A | * | 7/1994 | Ushida et al. | 327/355 |
| 5,515,014 A | * | 5/1996 | Troutman | 332/178 |

* cited by examiner

Primary Examiner—Robert Pascal
Assistant Examiner—Joseph Chang
(74) Attorney, Agent, or Firm—Jones Day; Krishna K. Pathiyal; Charles B. Meyer

(57) ABSTRACT

A device for providing the functionality of an oscillator and mixer is disclosed herein. The device uses a differential pair to provide first and second filter networks with a time varying signal. The first filter network generates an oscillating signal through the use of a generated negative resistance and provides the oscillating signal while filtering out unwanted signals. The second filter network receives the time varying input signal and the oscillating signal and provides a mixed output while preventing the transmission of oscillations at the oscillating signal frequency. A double balanced embodiment is also disclosed.

21 Claims, 7 Drawing Sheets

INTEGRAL MIXER AND OSCILLATOR DEVICE

CROSS REFERENCE TO RELATED APPLICATION

This application claims priority from and is related to the following prior application: Mixillator Device With Integral Mixer And Oscillator, U.S. Provisional Application No. 60/328,411, filed Oct. 12, 2001. This prior application, including the entire written description and drawing figures, is hereby incorporated into the present application by reference.

BACKGROUND

1. Technical Field

This invention relates generally to the fields of Radio Frequency (RF) mixers and oscillators. More particularly, the invention relates to the integration of mixers and oscillators.

2. Description of the Related Art

Oscillators are used to provide a time varying signal in electronic circuits and are well known to those of skill in the art. FIG. 1 illustrates a typical oscillator known in the art. This oscillator is a negative resistance cell 10. A simple differential pair of transistors $Q_1$ and $Q_2$ is shown. The emitters of both devices, $e_1$ and $e_2$, are connected, either by a short circuit or other connection, thereby defining a common node $n_1$. Current source $I_1$ is connected to the common node $n_1$. In the most basic case the current source $I_1$ is a direct current (DC) source, as shown.

$CN_1$ and $CN_2$ are symmetric coupling networks, which may consist of short circuits, capacitors, transistors, or other circuit elements alone or in combination. For instance, if $CN_1$ is an RC network, then $CN_2$ is preferably an identical RC network. Connecting coupling networks $CN_1$ between $b_1$ and $c_2$, and $CN_2$ between $b_2$ and $c_1$, as shown, generates a differential negative resistance between nodes a and a', or between any other two symmetric differential points in circuit 10 such as between bases $b_1$ and $b_2$, or even between corresponding differential points inside networks $CN_1$ and $CN_2$. For instance, if $CN_1$ has a first resistor, then by symmetry $CN_2$ preferably has a corresponding second resistor, and a differential negative resistance can be found between one node of the first resistor in $CN_1$ and another corresponding symmetric node of the second resistor in $CN_2$.

If a connection is made between a and a', such that the connection provides an impedance with a real component greater than or equal to the real value of the negative resistance, circuit 10 will oscillate. The frequency of the oscillation will be determined by the impedance connected between a and a'. The oscillating output signal is produced over the connection between a and a'. In frequency conversion applications, the desired output signal is typically used as a signal source for another circuit.

FIG. 2 illustrates a single balanced mixer 20, which is known in the art. A differential pair of transistors $Q_3$ and $Q_4$ is shown. The emitters $e_3$ and $e_4$ are connected in the same manner as those in FIG. 1, thereby defining common node $n_7$. A current source $I_2$ is connected to the common node $n_7$. In this instance, the current source $I_2$ has both a DC component ($I_{dc}$) and a frequency component ($I_{RF}$) at frequency $f_{RF}$.

Unlike the negative resistance cell 10, there is no cross coupling. Instead a frequency source, $S_1$, providing an LO (Local Oscillator) signal at frequency $f_{LO}$, is connected between bases $b_3$ and $b_4$. This LO signal varies the amount of current flowing through each transistor $Q_3$ and $Q_4$ such that the differential component of the current, provided by collectors $c_3$ and $c_4$ when a load is connected between nodes d and d', has frequency components at DC, $f_{LO}$, and $f_{LO} \pm f_{RF}$. In frequency conversion applications, the desired output signal is typically one of the frequency translated components of $I_{RF}$, at either $f_{LO}-f_{RF}$ (down-converter) or $f_{LO+fRF}$ (up-converter).

Although known oscillators and mixers can be combined, as they are in frequency conversion applications, the result is often far from ideal. In most applications, the mixer and oscillator are separate circuits. This results in an increase in both component area and power consumption, which results in a device that is costly to manufacture and operate. Furthermore, the physical distance between oscillator and mixer circuits often results in leakage of the local oscillator signal to other circuits, which is disadvantageous, as one of skill in the art will appreciate.

It is, therefore, desirable to provide a device that provides the functionality of both an oscillator and a mixer, which decreases the required power and area required to implement. Additionally, it would be desirable to provide a device that reduces the leakage of the oscillator signal to other circuits.

SUMMARY

It is an object of the present invention to obviate or mitigate at least one disadvantage of previous mixer-oscillator arrangements. It is a further object of the present invention to provide a device with integral oscillation and mixing functionality.

In a first aspect, the present invention provides a device, which has a plurality of nodes, for generating both an oscillating output signal and a mixed output signal based on a time varying input signal. The mixed output signal represents a translation of the input signal by the oscillating output signal. The device has a differential pair of transistors for receiving the time varying input signals and for generating a differential pair output signal having a time varying input component and other components, and a first filter network that is connected to the differential pair for receiving the varying input signal component from the differential pair. The first filter network selectively generates a negative resistance at the desired oscillating frequency across two nodes connected to the first filter network, and selectively provides the oscillating output signal by providing an impedance across the two nodes. Once the oscillating signal is established, the outputs of the differential pair contain frequency components of both the oscillating signal and signal components caused by the mixing of the input signal with the oscillating signal in the differential pair. Connected to the first filter network and the differential pair is a second filter network. The second filter network receives the oscillating output signal, and receives the other signal components, generates, and selectively passes the mixed output signal.

In a further embodiment, the time varying input signal has both time varying and constant components. In other embodiments, the negative resistance is generated across nodes connected to the collectors of the differential pair, and the magnitude of the resistance is proportional to the magnitude and frequency of the time varying input signal. Alternate embodiments include means for generating the mixed output signal by translating the oscillating output_ signal by the frequency of the time varying signal, this translation can be both positive and negative.

In a further embodiment of the present invention, the device has a second differential pair of transistors for receiving a second time varying input. The second differential pair provides this input to the first and second filter networks. The first filter network generates a negative resistance across two pairs of nodes in parallel with each other and the second filter network cancels output signals that have the frequency of the oscillating output signal. In alternate embodiments the time varying signals are out of phase with each other, and the overall negative resistance is substantially constant. In various embodiments, the first and second networks can be either high or low pass filters, either of which can be tuneable. In yet another embodiment, there is an input circuit that generates the out of phase time varying input signals using a differential pair of transistors connected to a constant signal, and a time varying signal and a biasing signal.

In a further aspect, the present invention provides a device for receiving a time varying input signal and for generating both an oscillating output signal, and a mixed output signal, the mixed output signal representing a translation of the oscillating output signal, the device having a plurality of nodes. The device has first and second differential pairs of transistors, each pair receiving a time varying input signal. A first filter network is operatively connected to the differential pairs and receives from them the two time varying input signals. These input signals are used to generate a negative resistance across two pairs of nodes connected in parallel to the first filter network. The first filter network selectively provides the oscillating output signal by providing an impedance across the parallel negative resistance. A second filter network is operatively connected to the two pairs of nodes, for receiving the oscillating output signal, and is also operatively connected to the differential pairs for receiving the time varying signals. The second filter network selectively passes the mixed output signal. In alternate embodiments of the present invention the time varying input signals are out of phase, the first filter network is a tuneable high pass filter, and the second filter network is a low pass filter.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached figures, wherein.

Same reference numerals are used in different figures to denote similar elements.

DETAILED DESCRIPTION OF THE DRAWINGS

Generally, the present invention provides a system for generating a mixed output signal and an oscillating output signal based on a time varying input signal. The mixed output signal is the oscillating signal translated by a time varying factor of the input signal. A dual balanced embodiment of the device that makes use of a differential pair to provide out of phase input signals is also disclosed. The device provides the functionality of both an oscillator and a mixer, which decreases the required power and area required to implement. Additionally it reduces the leakage of the oscillator signal to other circuits.

Figure 1:
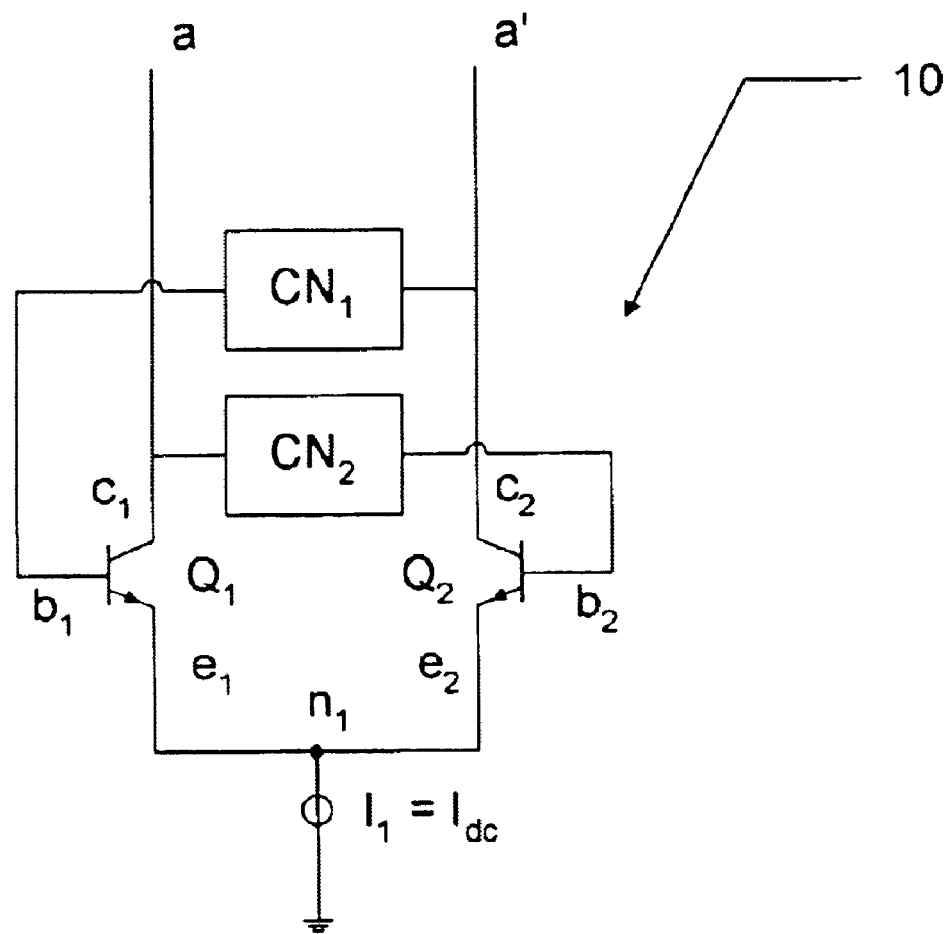
FIG. 1 is a schematic diagram showing an oscillator of the prior art.
Figure 2:
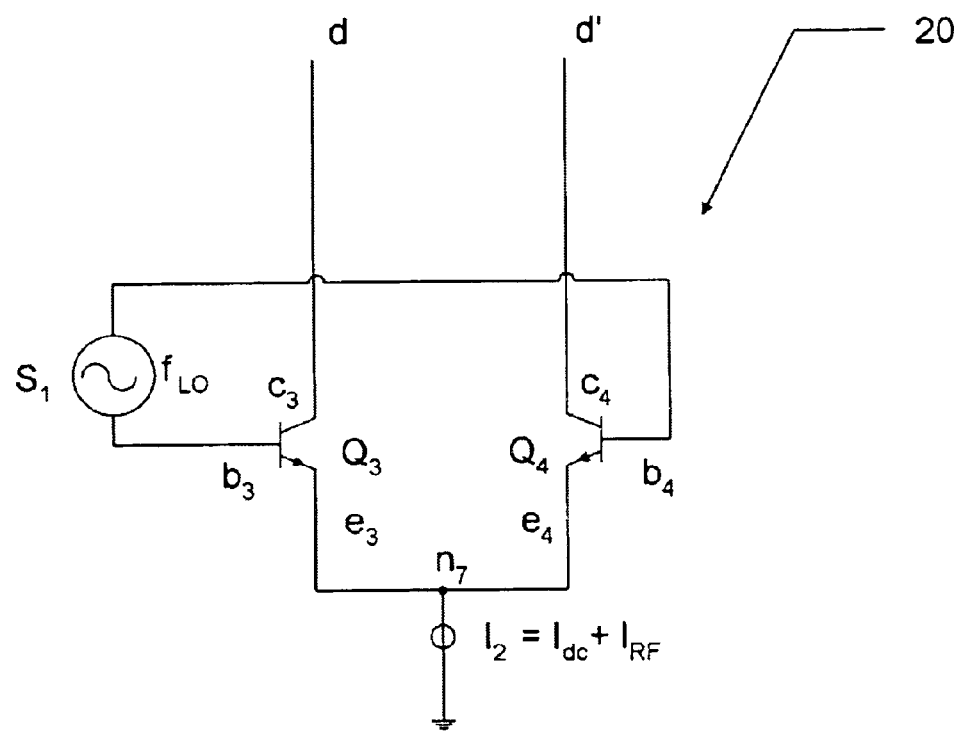
FIG. 2 is a schematic diagram showing a mixer of the prior art.
Figure 3:
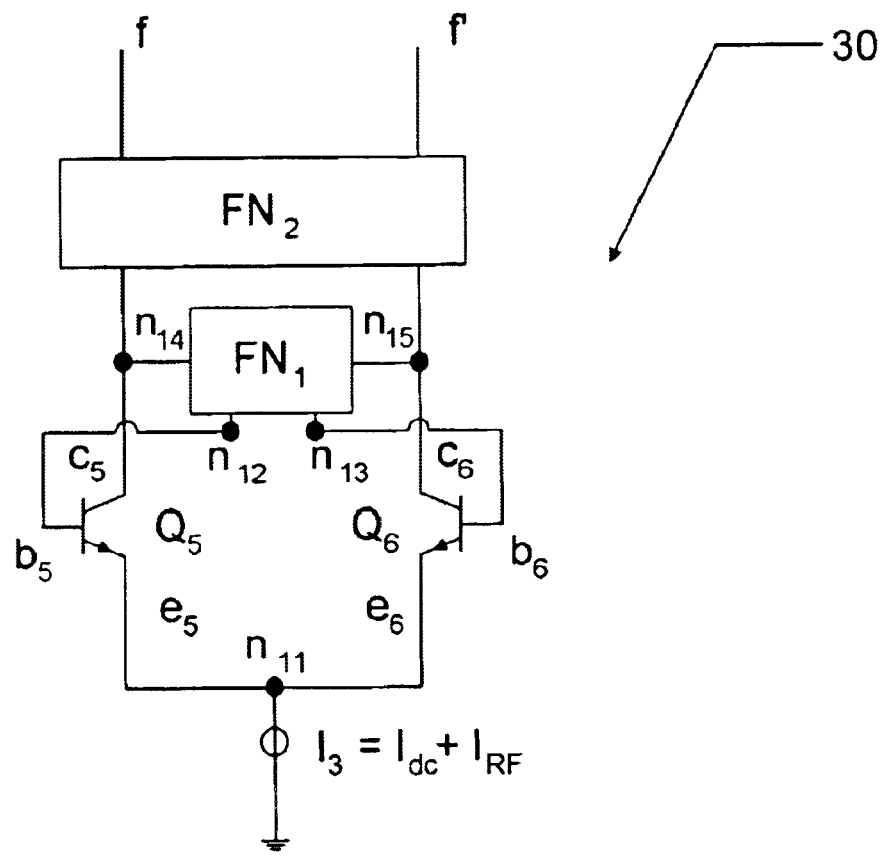
FIG. 3 is a schematic diagram showing an exemplary single balanced mixillator, according to an embodiment of the claimed invention.

FIG. 3 illustrates an embodiment of the present invention. The device 30 comprises a circuit with both oscillator and mixer functionality. Device 30, which is preferably referred to as a "mixillator", includes a simple differential pair of transistors $Q_5$ and $Q_6$, as well as two filter networks $FN_1$ and $FN_2$, for generating an oscillating output signal, LO, and mixing LO with an external input signal to produce an output mixed signal As with the separate oscillator 10 and mixer 20 of FIGS. 1 and 2, circuit 30 has a differential pair of transistors, $Q_5$ and $Q_6$, connected at the emitters $e_5$ and $e_6$ thereby defining common node $n_{11}$. A current source $I_3$, which has both DC ($I_{dc}$) and time varying or RF ($I_{RF}$) components is connected to the common node $n_{11}$. Connected to the collectors $c_5$ and $c_6$ of $Q_5$ and $Q_6$, are two filter networks, $FN_1$ and $FN_2$. $FN_1$ is further connected to bases $b_5$ and $b_6$ of $Q_5$ and $Q_6$. $FN_2$ provides a differential output between nodes f and f' which corresponds to the output of a conventional mixer driven by a conventional oscillator.

To understand the operation of device 30, consider the circuit of FIG. 3 in the absence of $FN_2$, where $I_{RF}=0$. Under these conditions, $FN_1$ connects $b_5$ and $b_6$ to $c_5$ and $c_6$. Thus $FN_1$ is analogous to a combination of $CN_1$ and $CN_2$ of FIG. 1, which connect $b_1$ to $c_2$ and $c_1$ to $b_2$ respectively. In this configuration, it is apparent that $FN_1$ must provide a negative resistance across two nodes connected to $FN_1$. These nodes can be internal to $FN_1$, as were the nodes in the prior art example, or external nodes such as $n_{12}$ and $n_{13}$ or $n_{14}$ and $n_{15}$. In the presently illustrated embodiment, $FN_1$ provides a negative resistance across nodes $n_{14}$ and $n_{15}$. A negative resistance must also be seen at $n_{12}$ and $n_{13}$, although it has a different value.

To further understand $FN_1$, consider the circuit of FIG. 3 in the absence of $FN_2$ and where $I_{RF}$ is non-zero. The single balanced mixer 20 of FIG. 2, provides current at the output d/d' of the circuit 20, the current having components at DC, $f_{LO}$, and $f_{LO} \pm f_{RF}$. Therefore, in the presence of an RF component, it is no longer sufficient for $FN_1$ to simply generate a negative resistance at the LO frequency, as was done in the prior art. In the embodiment of FIG. 3, $FN_1$ still generates a negative resistance at the desired oscillator frequency $f_{LO}$, but $FN_1$ preferably does not generate a negative resistance at the desired mixer output frequencies, $f_{LO}-f_{RF}$ or $f_{LO}+f_{RF}$. $FN_1$ provides negative resistance, and thus an oscillating output, between $b_5$ and $b_6$ at $f_{LO}$, but does not provide an oscillating output at the mixer output frequencies of $f_{LO}-f_{RF}$ or $f_{LO}+f_{RF}$. This frequency selectivity in $FN_1$ provides oscillator functionality in the presence of an RF component in the source current. If the $f_{LO}$ signal is to be used by other components, such as a PLL (Phase Locked Loop), the circuit should not be heavily loaded, and should be buffered by use of signal followers or other known techniques to isolate the circuit from the PLL. If it is desired, a pure oscillator signal can be obtained across nodes $n_{14}$ and $n_{15}$. This signal can be provided to other circuits in addition to the use described below.

The role of $FN_2$ in circuit 30 is now considered. $FN_2$ is complimentary to $FN_1$ to integrate the mixer functionality. $FN_2$ selectively passes the desired mixer output components, $f_{LO}-f_{RF}$ or $f_{LO}+f_{RF}$, to the differential output between f and f'. Additionally, $FN_2$ blocks the oscillation of the input components, at the desired oscillator frequency $f_{LO}$, from transmission by the differential output. In this manner $FN_2$ allows device 30 to provide mixer functionality integral with oscillator functionality in a single circuit.

Advantageously, in device 30, the same DC current, $I_{dc}$, provides a bias for both the mixer and oscillator functions, which provides power, cost, and component area savings. Furthermore, the proximity between oscillator function and mixer function achieved via integration of these functions reduces leakage of the local oscillator signal to other circuits.

Figure 4:
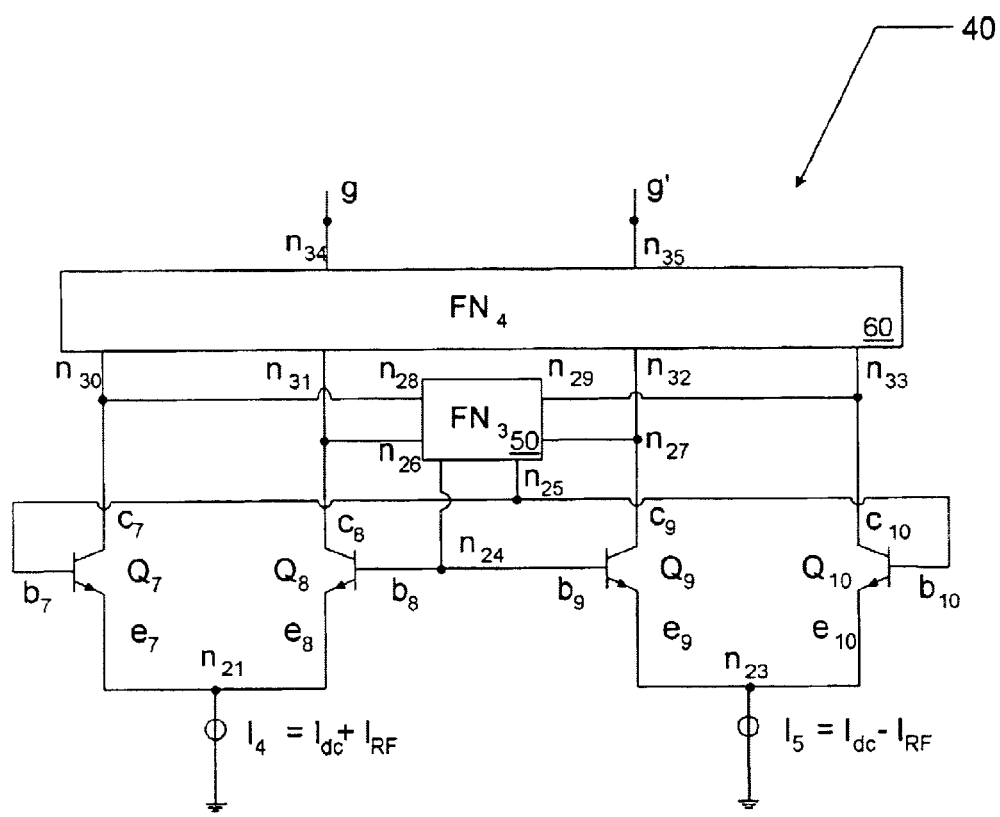
FIG. 4 is a schematic diagram showing an exemplary dual balanced mixillator according to a further embodiment of the claimed invention.

The concepts taught by example in FIG. 3 are adapted for use in a double balanced circuit 40 in FIG. 4. In this embodiment, the device 40 consists of two differential pairs, the pair formed by $Q_7$ and $Q_8$, and the pair formed by $Q_9$ and $Q_{10}$. The emitters of $Q_7$ and $Q_8$, $e_7$ and $e_8$ respectively, are connected to common emitter $n_{21}$, which is connected to current source $I_4$. The emitters of $Q_9$ and $Q_{10}$, $e_9$ and $e_{10}$ respectively, are connected to common emitter $n_{23}$, which is connected to current source $I_5$. The current source $I_4$ for the $Q_7$ and $Q_8$ pair contains components $I_{dc}+I_{RF}$, while the current source $I_5$ for the $Q_9$ and $Q_{10}$ pair contains components $I_{dc}-I_{RF}$.

$FN_3$, a filter network analogous to $FN_1$ of device 30, connects the collectors ($c_7$, $c_8$, $c_9$, and $c_{10}$) in pairs so as to generate a frequency selective negative resistance, analogous to the one described above in reference to FIG. 3. This frequency selective negative resistance is used in the oscillator function of device 40. Collectors $c_7$, $c_8$, $c_9$ and $c_{10}$ are connected to nodes $n_{28}$, $n_{26}$, $n_{27}$ and $n_{29}$ of $FN_3$ respectively. Bases $b_7$ and $b_{10}$ are connected to the common connection point $n_{25}$ whereas bases $b_8$ and $b_9$ are connected to the common connection point $n_{24}$, both $n_{25}$ and $n_{24}$ are connected to $FN_3$.

$FN_3$ preferably connects nodes $n_{28}$ and $n_{29}$ with node $n_{24}$ thereby connecting collectors $c_7$ and $c_{10}$ with bases $b_8$ and $b_9$ respectively, as well as preferably connecting nodes $n_{26}$ and $n_{27}$ with node $n_{25}$ thereby connecting collectors $c_8$ and $c_9$ with bases $b_7$ and $b_{10}$ respectively. In so doing, $FN_3$ provides two negative resistance cells in parallel. The first negative resistance cell is provided by connecting collectors $c_8$ and $c_7$ of transistors $Q_8$ and $Q_7$ to bases $b_7$ and $b_8$ respectively. This connection provides a first cell impedance between bases $b_7$ and $b_8$. The second negative resistance cell is provided by connecting collectors $c_9$ and $c_{10}$ of transistors $Q_9$ and $Q_{10}$ to bases $b_{10}$ and $b_9$ respectively. This second connection creates a second cell impedance between bases $b_9$ and $b_{10}$. The two negative resistance cells are connected in parallel because bases $b_7$ and $b_8$ of the first negative resistance cell are connected to bases $b_{10}$ and $b_9$ respectively of the second negative resistance cell.

A connection between any of $n_{28}$ and $n_{26}$, $n_{29}$ and $n_{27}$, $n_{24}$ and $n_{25}$, and various nodes internal to the $FN_3$ network, that has an impedance with a real component larger than the effective negative resistance provided by the parallel arrangement of the negative resistance cells causes circuit 40 to oscillate. As before the frequency of the oscillation is determined by the impedance of the connection. By selecting the impedance of the connection appropriately, circuit 40 provides an oscillating signal with the desired frequency. $FN_3$ is connected to the rest of circuit 40 via nodes $n_{24}$, $n_{25}$, $n_{26}$, $n_{27}$, $n_{28}$ and $n_{29}$ The value of the negative resistance created by $FN_3$ is dependant upon the source current. In device 40, $FN_3$ is driven by $I_4$ and $I_5$, whereas circuit 30 is driven by only $I_3$. $I_4=I_{dc}+I_{RF}$, while $I_5=I_{dc}-I_{RF}$, so the net current provided, $I_4+I_5$, is $(I_{dc}+I_{RF})+(I_{dc}-I_{RF})$ or $2I_{dc}$. Because the negative resistance is dependant upon the source current, the overall negative resistance provided by the parallel negative resistance cells remains substantially constant over variations in $I_{RF}$. This is an advance over the novel device 30 as illustrated in FIG. 3. Knowing that the impedance of the parallel negative resistance cells is substantially constant, all that must be done to provide oscillator functionality to circuit 40 is to have $FN_3$ provide an impedance that has a real component greater than the real component of the parallel negative resistance cells.

Advantageously, circuit 40 retains features of a traditional oscillator function as the oscillator output can be taken between bases $b_7$ and $b_8$, bases $b_9$ and $b_{10}$, or nodes $n_{24}$ and $n_{25}$.

$FN_4$, a filter network analogous to $FN_2$ of FIG. 3, is used to selectively pass the desired output frequencies to the mixer output between g and g', while rejecting components at the desired oscillator frequency. $FN_4$ is connected to circuit 40 via nodes $n_{30}$, $n_{31}$, $n_{32}$, $n_{33}$, $n_{34}$, and $n_{35}$ which are connected to collectors $c_7$, $c_8$, $c_9$ and $c_{10}$, and mixer outputs g and g', respectively.

Advantageously, the circuit 40 retains features of a traditional double balanced mixer function, with the mixer output available between nodes g and g'. With a double balanced topology such as that shown in FIG. 4, $FN_4$ can be designed such that the components at the LO frequency cancel, thereby rejecting the component at the LO frequency, to facilitate selectively passing the desired output components, as will be described in greater detail below in reference to FIG. 6.

Figure 5:
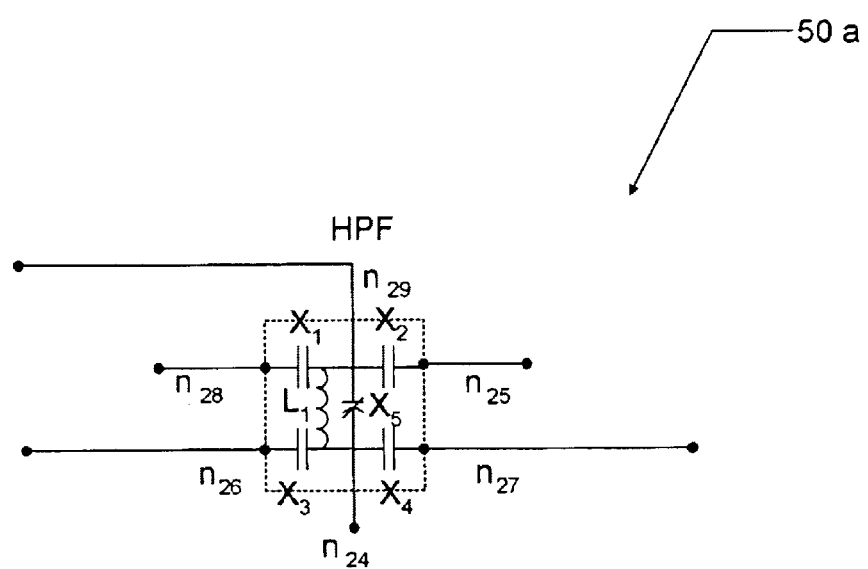
FIG. 5 is a schematic diagram showing an exemplary HPF (High Pass Filter) suitable for use as a filter network in a frequency down conversion application of the mixillator of FIG. 4.

FIG. 5 shows an exemplary HPF (High Pass Filter) 50a suitable for use as a filter network in a frequency down conversion application of the device 40 as illustrated in FIG. 4. Capacitors $X_1$, and $X_2$ are connected in series and are arranged to define node $n_{28}$ connected to the first capacitor $X_1$, node $n_{24}$ common to capacitors $X_1$ and $X_2$ and node $n_{29}$ connected to capacitor $X_2$. Capacitors $X_3$, and $X_4$ are connected in an analogous fashion defining node $n_{26}$ connected to capacitor $X_3$, node $n_{25}$ common to capacitors $X_3$ and $X_4$, and node $n_{27}$ connected to capacitor $X_4$. Variable capacitor $X_5$ and inductor $L_1$ are connected in parallel between nodes $n_{25}$ and $n_{24}$.

Capacitors $X_1$, $X_2$, $X_3$ and $X_4$, when connected as described herein and depicted in FIG. 5, provide cross coupling to generate a negative resistance necessary for oscillator functionality in device 40. The capacitive coupling creates a high pass network and ensures that the generated negative resistance is seen only at high frequencies, which is desirable for frequency down-conversion applications.

The combination of $X_5$ and $L_1$ form an exemplary tank circuit that can be used to generate sufficient real impedance to support oscillation. Additionally, the variable nature of $X_5$ provides means for tuning the oscillator frequency.

Figure 6:
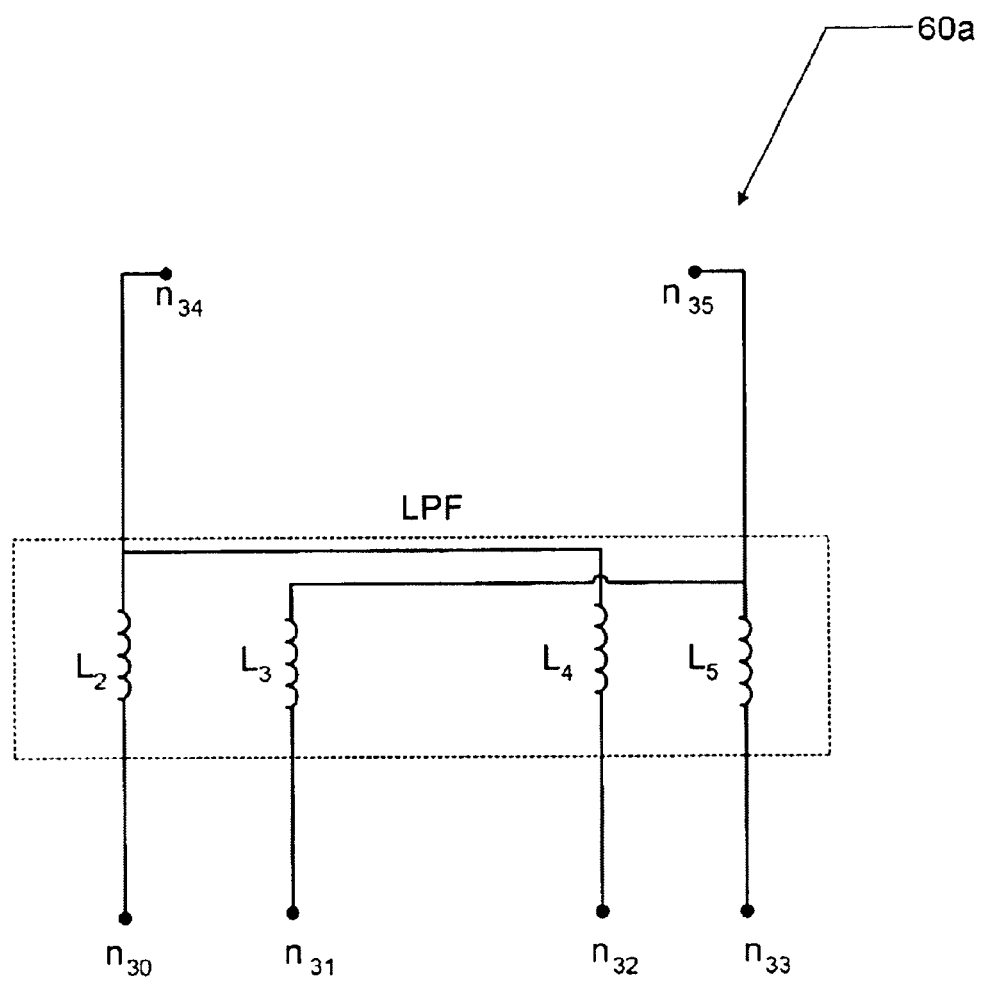
FIG. 6 is a schematic diagram showing an exemplary LPF (Low Pass Filter) suitable for use as a filter network in a frequency down conversion application of the mixillator of FIG. 4.

FIG. 6 shows an exemplary LPF (Low Pass Filter) 60a suitable for use as a filter network in a frequency down conversion application of the circuit 40 as illustrated in FIG. 4. Inductors $L_2$ and $L_4$ are connected in series and are arranged to define node $n_{30}$ connected to inductor $L_2$, node $n_{34}$ common to inductors $L_2$ and $L_4$ and node $n_{32}$ connected to inductor $L_4$. Inductors $L_3$, and $L_5$ are connected in an analogous fashion defining node $n_{31}$ connected to inductor $L_3$, node $n_{35}$ common to inductors $L_3$ and $L_5$, and node $n_{33}$ connected to inductor $L_5$.

At low frequencies LPF 60 operates to connect $c_7$ to $c_9$ and $c_8$ to $c_{10}$ as typically found in a double balanced mixer. These connections allow LPF 60 to cancel the RF and LO frequency components at the output, while selectively passing the RF–LO frequency component.

Figure 7:
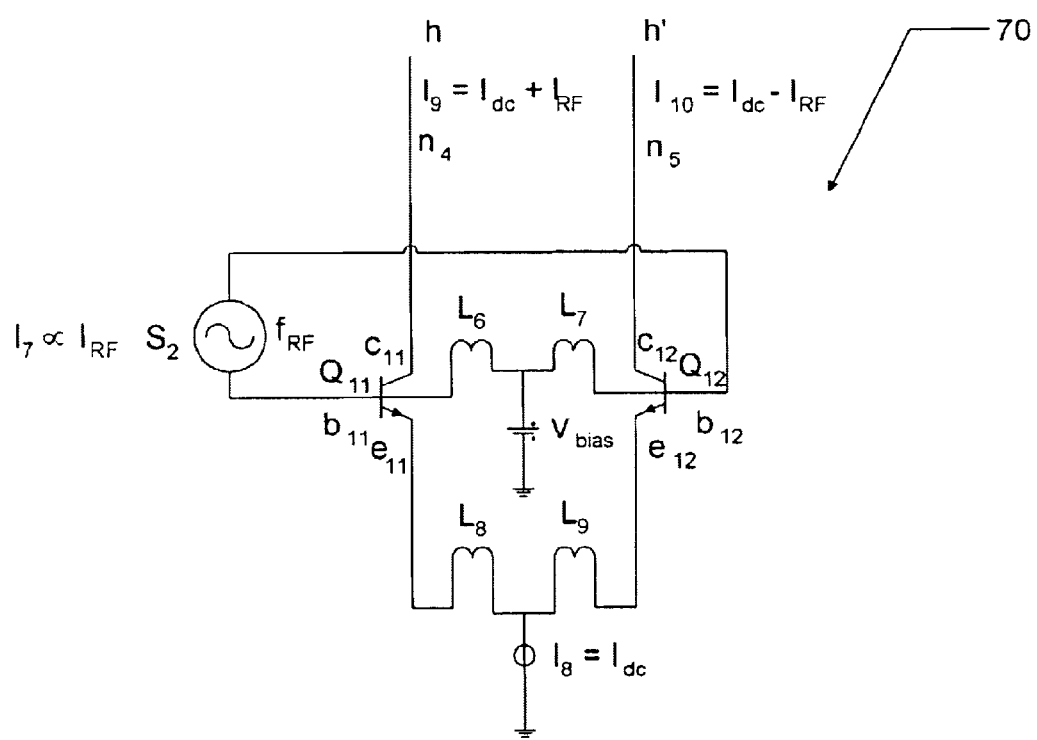
FIG. 7 is a schematic diagram showing an exemplary input stage suitable for use as the two current sources for the dual balanced mixillator of FIG. 4.

Referring to FIG. 7, an input stage circuit 70 is illustrated. Input stage circuit 70 is used, in one embodiment, to provide input currents for the double balanced device 40 of FIG. 4. A differential pair of transistors $Q_{11}$ and $Q_{12}$ is shown. An RF signal source $S_2$ drives a radio frequency signal $I_7 \propto I_{RF}$ between bases $b_{11}$ and $b_{12}$, with output at nodes h and h'.

To reduce the noise contributions of the input differential pair biasing for $Q_{11}$ and $Q_{12}$ is provided in this embodiment. The biasing is such that at low frequencies it presents low impedance, in order to minimize noise appearing at $b_{11}$ and $b_{12}$. This noise, if unimpeded, modulates the oscillator and appears as phase noise at the oscillating nodes (bases $b_7$ and $b_8$, bases $b_9$ and $b_{10}$, or other nodes internal to FN3).

Inductors $L_6$ and $L_7$ are connected in series between bases $b_{11}$ and $b_{12}$ to provide at low frequencies, typically from DC to 5 or 10 MHz, low impedance which reduces phase noise. At high frequencies, typically near RF, $L_6$ and $L_7$ provide high impedance to avoid shunting the desired RF signal away from the bases. A bias voltage $V_{bias}$ is provided between inductors $L_6$ and $L_7$ to satisfy the biasing requirements of both $Q_{11}$ and $Q_{12}$.

If linearity requirements are such that degenerative impedance is suggested, inductors $L_8$ and $L_9$ connected in series between emitters $e_{11}$ and $e_{12}$ are used for the same reasons as $L_6$ and $L_7$ above. However, if degenerative impedance is not suggested, then inductors $L_8$ and $L_9$ can be replaced by short circuits. A DC source, $I_8 = 2*I_{dc}$, is connected between inductors $L_8$ and $L_9$.

The two output signals, $I_9 = I_{dc} + I_{RF}$ and $I_{10} = I_{dc} - I_{RF}$, are provided by collectors $c_{11}$ and $c_{12}$ of transistors $Q_{11}$ and $Q_{12}$, at nodes h and h' respectively. Circuit 70 is therefore used in a presently preferred embodiment to provide source 14 and 15 for device 40 by connecting nodes h and h' of input stage circuit 70 to nodes $n_{21}$ and $n_{23}$ of device 40, respectively.

Although not expressly shown in the drawings, any type of transistor can be used, including but not limited to Field Effect Transistors (FET's), GaAs devices, PHemt, and the like. Furthermore, although NPN transistors are used in the drawings, it would be obvious to a person skilled in the art to use complementary devices and invert the structure illustrated, or to use both non-complementary and complementary devices. Further still, current sources can be realized in different ways such as by using resistors and inductors and substitution of one current source for another will be obvious to a person skilled in the art. Also, although the drawings illustrate using a HPF for $FN_3$ and a LPF for $FN_4$ in a frequency down conversion application, it would be obvious to a person skilled in the art to invert their roles and use a LPF for $FN_3$ and a HPF for $FN_4$ in a frequency up conversion application. It would be obvious as well to a person skilled in the art to use voltage signals instead of or in conjunction with the current signals illustrated. Other types of filter structures can be used, and the use of alternate filter structures will also be obvious to a person skilled in the art. Other types of filters can lead to other applications, which are also considered to be within the scope of the invention.

The above-described embodiments of the present invention are intended to be examples only. Those of skill in the art may effect alterations, modifications and variations to the particular embodiments without departing from the scope of the invention, which is defined solely by the claims appended hereto.

What is claimed is:

1. A device for receiving a time varying input signal and for generating both an oscillating output signal and a mixed output signal, the mixed output signal representing a translation of the oscillating output signal, the device comprising:
   (a) a differential pair of transistors for receiving the time varying input signal and for generating a differential pair output signal having a time varying input signal component and other signal components;
   (b) a first filter network, operatively connected to the differential pair for receiving the varying input signal component from the differential pair, for generating a negative resistance across two nodes connected to the first filter network, and for selectively providing the oscillating output signal by providing an impedance across the two nodes; and
   (c) a second filter network, operatively connected to the two nodes, for receiving the oscillating output signal, and operatively connected to the differential pair for receiving the other signal components, for generating and selectively passing the mixed output signal.

2. The device of claim 1, wherein the input signal has time varying and constant components.

3. The device of claim 1, wherein the magnitude of the negative resistance is proportional to the magnitude and frequency of the time varying input signal.

4. The device of claim 1, wherein the first filter network generates the negative resistance across nodes connected to the collectors of the differential pair of transistors.

5. The device of claim 1, wherein the second filter network includes means for generating the mixed output signal by translation of the oscillating output signal by the frequency of the time varying signal.

6. The device of claim 1, wherein the mixed output signal has a frequency equal to the frequency of the oscillating output signal plus the frequency of the time varying input signal.

7. The device of claim 1, wherein the mixed output signal has a frequency equal to the frequency of the oscillating output signal minus the frequency of the time varying input signal.

8. The device of claim 1, further comprising:
   (d) a second differential pair of transistors for receiving a second time varying input signal, the second differential pair being operatively connected to the first and second filter networks for providing the second time varying input signal;
wherein the first filter network creates a negative resistance across two pairs of nodes in parallel with each other, and wherein the second filter network cancels output signals at the frequency of the oscillating output signal.

9. The device of claim 8, wherein the first and second time varying signals have time varying and constant components.

10. The device of claim 9, wherein the first and second time varying signals are out of phase with each other.

11. The device of claim 10, further comprising a input staging circuit operatively attached to the differential pairs for providing the time varying input signals, the input staging circuit having a differential pair of transistors operatively connected to a constant signal, a time varying signal and a biasing signal for generating the two out of phase time varying input signals.

12. The device of claim 11, wherein the first filter network is a tuneable high pass filter, and the second filter network is a low pass filter.

13. The device of claim 8, wherein the second filter network is a high pass filter.

14. The device of claim 8, wherein the second filter network is a low pass filter.

15. The device of claim 8, wherein the first filter network is a low pass filter.

16. The device of claim 15, wherein the low pass filter is tuneable.

17. The device of claim 8, wherein the overall negative resistance of the parallel negative resistances is substantially constant.

18. The device of claim 8, wherein the first filter network is a high pass filter.

19. The device of claim 18, wherein the high pass filter is tuneable.

20. A device for receiving a time varying input signal and for generating both an oscillating output signal, and a mixed output signal, the mixed output signal representing a translation of the oscillating output signal, the device comprising:

(a) first and second differential pairs of transistors for each receiving the time varying input signal and for each generating a differential pair output signal having a time varying input signal component and other signal components;

(b) a first filter network, operatively connected to the differential pairs for receiving the varying input signals from the differential pairs, for generating a negative resistance across two pairs of nodes connected in parallel to the first filter network, and for selectively providing the oscillating output signal by providing an impedance across the parallel negative resistances; and (c) a second filter network, operatively connected to the two pairs of nodes, for receiving the oscillating output signal, and operatively connected to the differential pairs for receiving the other signal components, for generating and selectively passing the mixed output signal.

21. The device of claim 20, wherein the time varying input signals are out of phase.

* * * * *